US011196016B2

(12) United States Patent
Huangfu et al.

(10) Patent No.: US 11,196,016 B2
(45) Date of Patent: Dec. 7, 2021

(54) PIXEL STRUCTURE, DISPLAY APPARATUS, AND METHOD OF FABRICATING PIXEL STRUCTURE

(71) Applicant: BOE Technology Group Co., Ltd., Beijing (CN)

(72) Inventors: Lujiang Huangfu, Beijing (CN); Xing Fan, Beijing (CN); Zheng Liu, Beijing (CN); Yan Fan, Beijing (CN); Liangjian Li, Beijing (CN); Hao Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 68 days.

(21) Appl. No.: 16/632,191

(22) PCT Filed: Nov. 20, 2018

(86) PCT No.: PCT/CN2018/116467
§ 371 (c)(1),
(2) Date: Jan. 17, 2020

(87) PCT Pub. No.: WO2020/102984
PCT Pub. Date: May 28, 2020

(65) Prior Publication Data
US 2021/0226152 A1   Jul. 22, 2021

(51) Int. Cl.
*H01L 51/52* (2006.01)
*H01L 51/56* (2006.01)

(52) U.S. Cl.
CPC ...... *H01L 51/5218* (2013.01); *H01L 51/5209* (2013.01); *H01L 51/5234* (2013.01); *H01L 51/56* (2013.01)

(58) Field of Classification Search
CPC . H01L 51/5218; H01L 51/5234; H01L 51/56; H01L 51/5209
See application file for complete search history.

(56) References Cited

U.S. PATENT DOCUMENTS 6,777,871 B2   8/2004   Duggal et al.
7,432,649 B2   10/2008   West
(Continued)

FOREIGN PATENT DOCUMENTS

CN   1497751 A     5/2004
CN   102386338 A   3/2012
(Continued)

OTHER PUBLICATIONS

International Search Report & Written Opinion dated Aug. 26, 2019, regarding PCT/CN2018/116467.

*Primary Examiner* — Kyoung Lee
*Assistant Examiner* — Christina A Sylvia
(74) *Attorney, Agent, or Firm* — Intellectual Valley Law, P.C.

(57) ABSTRACT

A pixel structure includes a base substrate and a light emitting element on the base substrate. The light emitting element includes a reflective electrode, a light emitting layer on the reflective electrode, and a substantially transparent electrode on a side of the light emitting layer away from the reflective electrode. The reflective electrode has a reflective ridge configured to reflect light laterally transmitted through the light emitting layer to exit from a light emitting surface of the pixel structure. The reflective ridge has a first concave reflective sidewall extending from a peak of the reflective ridge to a base of the reflective ridge, and a second concave reflective sidewall extending from the peak of the reflective ridge to the base of the reflective ridge. The first concave reflective sidewall faces away from the second concave reflective sidewall.

19 Claims, 14 Drawing Sheets

(56) References Cited

U.S. PATENT DOCUMENTS

| | | |
|---|---|---|
| 8,373,341 B2 | 2/2013 | Xue et al. |
| 8,538,224 B2 | 9/2013 | Lamansky et al. |
| 8,987,767 B2 | 3/2015 | Lee et al. |
| 9,508,957 B2 | 11/2016 | Forrest et al. |
| 9,536,931 B2 | 1/2017 | Choi et al. |
| 2002/0122144 A1* | 9/2002 | Yoshida ............ G02F 1/133603 349/61 |
| 2004/0070335 A1 | 4/2004 | Cok |
| 2005/0285512 A1* | 12/2005 | Murayama ......... H01L 27/3283 313/504 |
| 2012/0049724 A1 | 3/2012 | Nakai et al. |
| 2014/0239259 A1 | 8/2014 | Lim et al. |
| 2015/0034656 A1 | 2/2015 | Chen |
| 2015/0206927 A1 | 7/2015 | Kudo et al. |
| 2016/0126503 A1 | 5/2016 | Huangfu et al. |
| 2016/0190217 A1* | 6/2016 | Park .................... H01L 27/3246 257/40 |
| 2016/0268554 A1 | 9/2016 | Wu et al. |
| 2017/0092705 A1 | 3/2017 | Lim et al. |
| 2017/0155094 A1 | 6/2017 | Joung et al. |
| 2017/0256748 A1 | 9/2017 | Koike et al. |
| 2017/0294493 A1 | 10/2017 | Yoo et al. |
| 2017/0324063 A1 | 11/2017 | Ohara et al. |
| 2018/0190932 A1 | 7/2018 | Koo et al. |
| 2018/0331325 A1* | 11/2018 | Zhang ................. H01L 51/5209 |

FOREIGN PATENT DOCUMENTS

| | | |
|---|---|---|
| CN | 104396345 A | 3/2015 |
| CN | 103996693 B | 5/2016 |
| CN | 106717121 A | 5/2017 |
| CN | 106816454 A | 6/2017 |
| CN | 106935621 A | 7/2017 |
| CN | 107006096 A | 8/2017 |
| CN | 107068891 A | 8/2017 |
| CN | 107170904 A | 9/2017 |
| CN | 107331785 A | 11/2017 |
| CN | 108258140 A | 7/2018 |
| KR | 20060100902 A | 9/2006 |

* cited by examiner

US 11,196,016 B2

PIXEL STRUCTURE, DISPLAY APPARATUS, AND METHOD OF FABRICATING PIXEL STRUCTURE

CROSS-REFERENCE TO RELATED APPLICATION

This application is a national stage application under 35 U.S.C. § 371 of International Application No. PCT/CN2018/116467, filed Nov. 20, 2018, the contents of which are incorporated by reference in the entirety.

TECHNICAL FIELD

The present invention relates to display technology, more particularly, to a pixel structure, a display apparatus, and a method of fabricating a pixel structure.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatuses.

SUMMARY

In one aspect, the present invention provides a pixel structure, comprising a base substrate; and a light emitting element on the base substrate; the light emitting element comprising a reflective electrode, a light emitting layer on the reflective electrode, and a substantially transparent electrode on a side of the light emitting layer away from the reflective electrode; wherein the reflective electrode has a reflective ridge configured to reflect light laterally transmitted through the light emitting layer to exit from a light emitting surface of the pixel structure; and wherein the reflective ridge has a first concave reflective sidewall extending from a peak of the reflective ridge to a base of the reflective ridge, and a second concave reflective sidewall extending from the peak of the reflective ridge to the base of the reflective ridge, the first concave reflective sidewall facing away from the second concave reflective sidewall.

Optionally, the pixel structure further comprises an insulating ridge on a side of the reflective electrode facing the base substrate; wherein the insulating ridge has a first concave insulating sidewall extending from a peak of the insulating ridge to a base of the insulating ridge, and a second concave insulating sidewall extending from the peak of the insulating ridge to the base of the insulating ridge, the first concave insulating sidewall facing away from the second concave insulating sidewall; and the reflective electrode is on the first concave insulating sidewall and the second concave insulating sidewall, thereby forming the first concave reflective sidewall and the second concave reflective sidewall.

Optionally, each of the first concave reflective sidewall and the second concave reflective sidewall has a radius of curvature in a range of approximately 400 nm to approximately 750 nm.

Optionally, the peak of the reflective ridge has a width less than five times a process margin for forming the peak of the reflective ridge.

Optionally, the pixel structure further comprises an optical layer between the reflective ridge and the light emitting layer; wherein an orthographic projection of the optical layer on the base substrate at least partially overlaps with an orthographic projection of the reflective ridge on the base substrate.

Optionally, the optical layer has a convex side away from the reflective ridge; and the convex side has a radius of curvature in a range of approximately 500 nm to approximately 1500 nm.

Optionally, the optical layer has a first concave sidewall extending from a peak of the optical layer to a base of the optical layer, and a second concave sidewall extending from the peak of the optical layer to the base of the optical layer, the first concave sidewall facing away from the second concave sidewall.

Optionally, the reflective ridge is a continuously connected ridge.

Optionally, the reflective ridge comprises a plurality of sub-ridges spaced apart from each other.

Optionally, each of the plurality of sub-ridges has a cross-section along a plane substantially parallel to a main surface of the base substrate, the cross-section has a shape selected from a group consisting of a rectangle, a circle, and an ellipse.

Optionally, the pixel structure further comprises a pixel definition layer on the base substrate and defining a pixel aperture; the light emitting element configured to emit light to exit from a light emitting surface of the pixel structure through the pixel aperture; and the reflective ridge is inside the pixel aperture.

Optionally, the reflective ridge divides the pixel aperture into a plurality of sub-regions.

In another aspect, the present invention provides a display apparatus, comprising the pixel structure described herein or fabricated by a method described herein.

In another aspect, the present invention provides a method of fabricating a pixel structure, comprising forming a light emitting element on a base substrate; wherein forming the light emitting element comprises forming a reflective electrode, forming a light emitting layer on the reflective electrode, and forming a substantially transparent electrode on a side of the light emitting layer away from the reflective electrode; wherein the reflective electrode is formed to have a reflective ridge configured to reflect light laterally transmitted through the light emitting layer to exit from a light emitting surface of the pixel structure; and wherein the reflective ridge is formed to have a first concave reflective sidewall extending from a peak of the reflective ridge to a base of the reflective ridge, and a second concave reflective sidewall extending from the peak of the reflective ridge to the base of the reflective ridge, the first concave reflective sidewall facing away from the second concave reflective sidewall.

Optionally, prior to forming the reflective electrode, the method further comprises forming an insulating ridge; wherein the insulating ridge is formed to have a first concave insulating sidewall extending from a peak of the insulating ridge to a base of the insulating ridge, and a second concave insulating sidewall extending from the peak of the insulating ridge to the base of the insulating ridge, the first concave insulating sidewall facing away from the second concave insulating sidewall; and the reflective electrode is formed on the first concave insulating sidewall and the second concave insulating sidewall, thereby forming the first concave reflective sidewall and the second concave reflective sidewall.

Optionally, forming the insulating ridge comprises depositing an insulating material layer on the base substrate; forming a photoresist layer on the insulating material layer; exposing and developing the photoresist layer using mask plate having a pattern corresponding to the insulating ridge; and etching the insulating material layer using an isotropic etching method, thereby forming the first concave insulating sidewall and the second concave insulating sidewall.

Optionally, subsequent to forming the reflective electrode and prior to forming the light emitting layer, the method further comprising forming an optical layer; wherein the optical layer is formed between the reflective ridge and the light emitting layer; and an orthographic projection of the optical layer on the base substrate at least partially overlaps with an orthographic projection of the reflective ridge on the base substrate.

Optionally, the optical layer is formed using an organic material; the optical layer is formed to have a convex side away from the reflective ridge; and the convex side has a radius of curvature in a range of approximately 500 nm to approximately 1500 nm.

Optionally, the optical layer is formed using an inorganic material; and the optical layer is formed to have a first concave sidewall extending from a peak of the optical layer to a base of the optical layer, and a second concave sidewall extending from the peak of the optical layer to the base of the optical layer, the first concave sidewall facing away from the second concave sidewall.

Optionally, the method further comprises forming a pixel definition layer on the base substrate for defining a pixel aperture; wherein the reflective ridge is formed inside the pixel aperture.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

A light emitting element of a display panel typically includes a first electrode, a light emitting layer, and a second electrode. For example, an organic light emitting diode includes an anode, an organic functional layer on the anode, and a cathode on the organic functional layer. Typically, a refractive index of a light emitting element (e.g., the refractive index of an organic function layer in an organic light emitting diode) is much greater than the refractive index of an outside medium (e.g., air or a passivation layer). As a result, light emitted from a light emitting element can exit from a light emitting surface of the pixel structure only when an incident angle of the emitted light is within a certain range. Light emitted from the light emitting element having an incident angle outside the certain range undergoes a total reflection on the interface between the light emitting element and the outside medium. The light which is totally reflected is transmitted inside the light emitting element, which functions as a waveguide for guiding the emitted light. However, light emitting element such as the organic functional layer in the organic light emitting diode is not a perfect waveguide. Light transmitted through the organic functional layer is prone to light loss during the transmission, and eventually dissipates at the edge of the organic functional layer.

Figure 1:
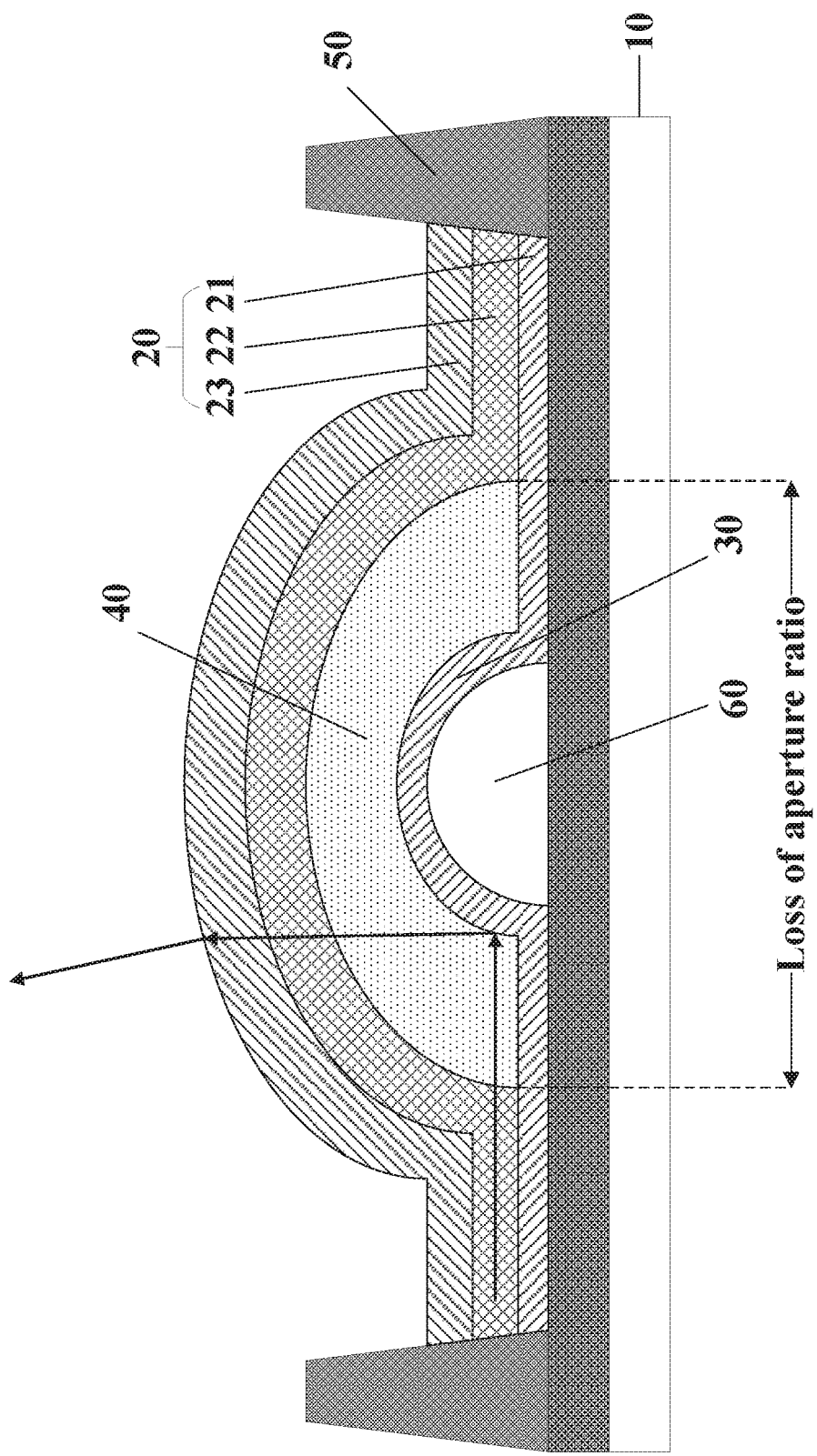
FIG. 1 is a schematic diagram of a pixel structure in some embodiments according to the present disclosure.

FIG. 1 is a schematic diagram of a pixel structure in some embodiments according to the present disclosure. Referring to FIG. 1, the pixel structure in some embodiments includes a reflective ridge 30 on a base substrate 10 to prevent light loss of light emitted from the light emitting layer 22 and laterally transmitted through the light emitting layer 22 as a waveguide. The reflective ridge 30 can be formed using a reflective electrode 21 of the light emitting element 20. FIG. 1 shows a pixel aperture defined by a pixel definition layer 50 in a subpixel. As shown in FIG. 1, a light beam laterally transmitted through the light emitting layer 22 as a waveguide is reflected by the reflective ridge 30, the light beam is reflected along a direction to exit the pixel structure from a light emitting surface of the pixel structure. Specifically, the laterally transmitted light beam is reflected by a side wall of the reflective ridge 30, the reflected light transmits upward through the light emitting layer 22 and a substantially transparent electrode 23, and exit the pixel structure from the light emitting surface (e.g., an outer surface of the substantially transparent electrode 23) of the pixel structure. By having a reflective ridge in the pixel aperture, light loss due to transmission in the light emitting layer 22 as the waveguide can be reduced or prevented.

The reflective ridge 30 can be disposed in any appropriate place of the pixel structure, e.g., around an edge of the pixel aperture. Optionally, the reflective ridge 30 may divide the pixel aperture into several sub-regions. The reflective ridge 30 may be formed by disposing the reflective electrode 21 on an insulating ridge 60.

The pixel structure further includes an optical layer 40 on a side of the reflective ridge 30 away from the base substrate 10. The laterally transmitted light beam reflected by the side wall of the reflective ridge 30 transmits upward through the optical layer 40, the light emitting layer 22, and a substantially transparent electrode 23, to the outside of the pixel structure. As shown in FIG. 1, inclusion of a reflective ridge 30 (along with the optical layer 40) results in loss of aperture ratio of the display panel. Specifically, loss of aperture ratio occurs in regions occupied by the optical layer 40.

Figure 2:
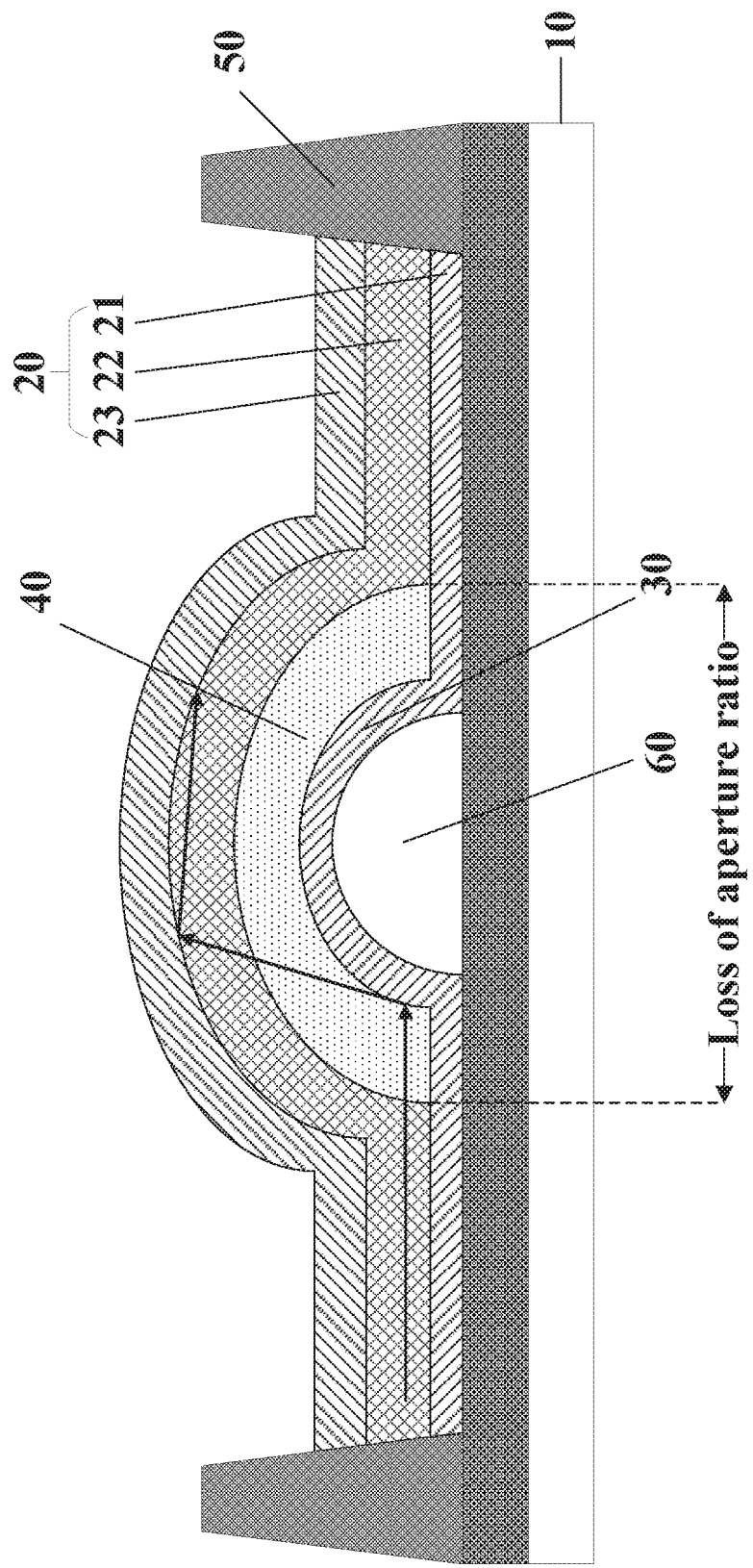
FIG. 2 is a schematic diagram of a pixel structure in some embodiments according to the present disclosure.

To reduce the loss of aperture ratio, a smaller optical layer may be fabricated. FIG. 2 is a schematic diagram of a pixel structure in some embodiments according to the present disclosure. Referring to FIG. 2, the optical layer 40 in FIG. 2 is made thinner than that in FIG. 1, and occupies a smaller area of the pixel structure. Accordingly, loss of aperture ratio in the display panel is reduced due to a smaller area occupied by the optical layer 40. However, a thinner optical layer is associated with other issues. For example, a thinner optical layer may function as a waveguide when combined with other layers of the pixel structure such as the light emitting layer 22. As shown in FIG. 2, a light beam laterally transmitted through the light emitting layer 22 as the waveguide is reflected by the reflective ridge 30. The reflected light beam continues to transmit within a waveguide formed by a combination of the optical layer 40 and the light emitting layer 22. The light beam is totally reflected within the waveguide formed by the combination of the optical layer 40 and the light emitting layer 22, and continues to transmit laterally rather than exiting from the light emitting surface of the pixel structure.

Accordingly, the present disclosure provides, inter alia, a pixel structure, a display apparatus, and a method of fabricating a pixel structure that substantially obviate one or more of the problems due to limitations and disadvantages of the related art. In one aspect, the present disclosure provides a pixel structure. In some embodiments, the pixel structure includes a base substrate and a light emitting element on the base substrate. The light emitting element includes a reflective electrode, a light emitting layer on the reflective electrode, and a substantially transparent electrode on a side of the light emitting layer away from the reflective electrode. The reflective electrode has a reflective ridge configured to reflect light laterally transmitted through the light emitting layer to exit from a light emitting surface of the pixel structure. The reflective ridge has a first concave reflective sidewall extending from a peak of the reflective ridge to a base of the reflective ridge, and a second concave reflective sidewall extending from the peak of the reflective ridge to the base of the reflective ridge, the first concave reflective sidewall facing away from the second concave reflective sidewall. Optionally, the light emitting element is an organic light emitting diode in a subpixel of a display panel, and the light emitting element includes a reflective electrode (e.g., a reflective anode), an organic functional layer, and a substantially transparent electrode (e.g., a substantially transparent cathode). Optionally, the organic functional layer includes an organic light emitting layer and optionally other organic layers such as a hole transportation layer, a hole injection layer, an electron injection layer, and an electron transportation layer. As used herein, the term "substantially transparent" means at least 50 percent (e.g., at least 60 percent, at least 70 percent, at least 80 percent, at least 90 percent, and at least 95 percent) of light in the visible wavelength range transmitted therethrough.

Figure 3:
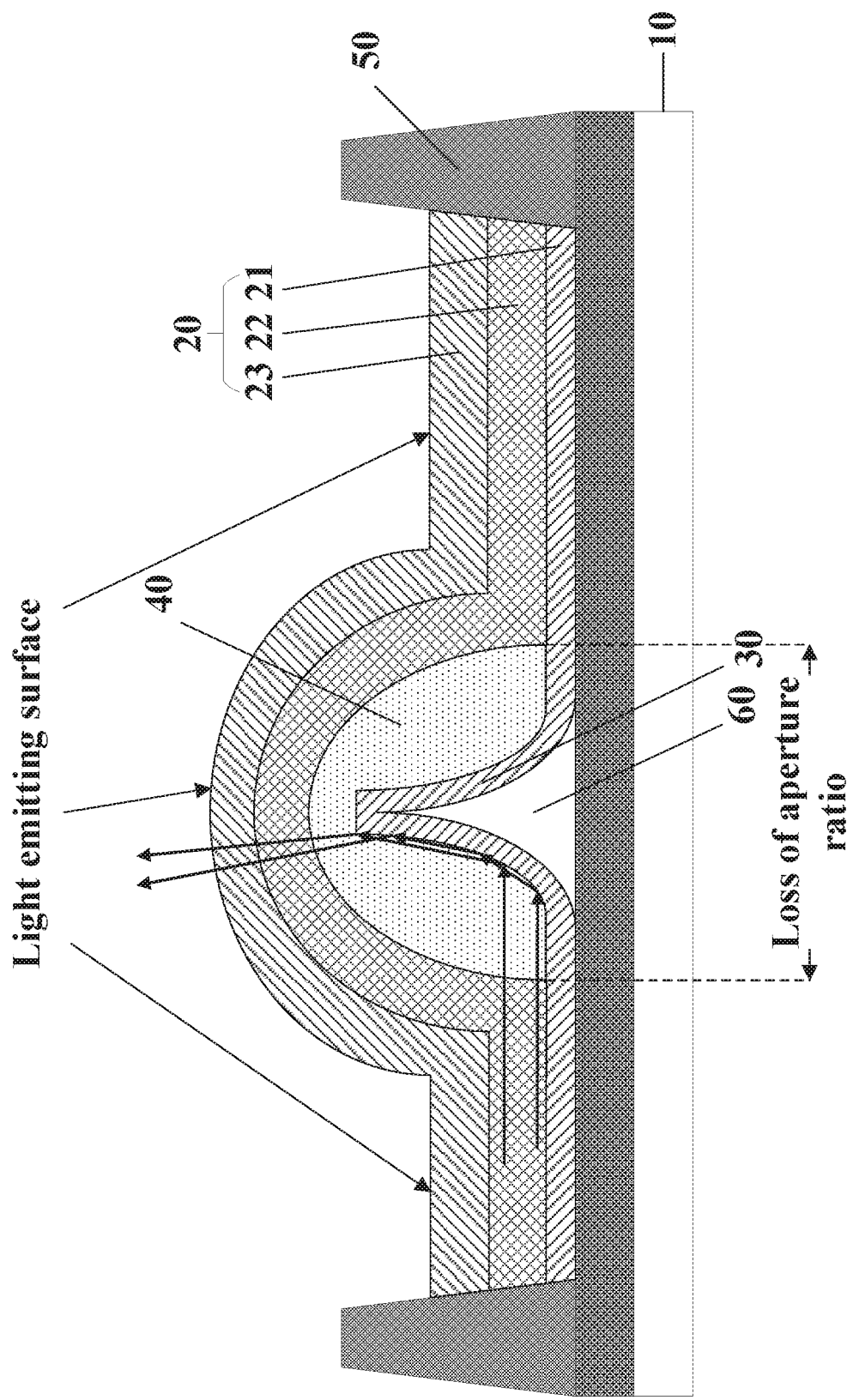
FIG. 3 is a schematic diagram of a pixel structure in some embodiments according to the present disclosure.

FIG. 3 is a schematic diagram of a pixel structure in some embodiments according to the present disclosure. Referring to FIG. 3, the pixel structure in some embodiments includes a base substrate 10, a pixel definition layer 50 for defining a pixel aperture corresponding to a subpixel, and a light emitting element 20 in the pixel aperture. The light emitting element 20 includes a reflective electrode 21, a light emitting layer 22 on the reflective electrode 21, and a substantially transparent electrode 23 on a side of the light emitting layer 22 away from the reflective electrode 21. The reflective electrode 21 in some embodiments has a reflective ridge 30 configured to reflect light laterally transmitted through the light emitting layer 22 to exit from a light emitting surface of the pixel structure. In contrast to the structures of the reflective ridge 30 in FIG. 1 and FIG. 2, the reflective ridge 30 in FIG. 3 has a concave side wall configured to reflect light upwards to exit from a light emitting surface of the pixel structure. As shown in FIG. 3, a light beam laterally transmitted through the light emitting layer 22 as the waveguide is reflected by a concaved side wall of the reflective ridge 30. The concavely curved surface of the concaved side wall reflects the light beam continuously, a light path of the light beam is substantially along the surface curvature of the concaved side wall. The light beam is then transmitted to an optical layer 40 on a side of the reflective ridge 30 away from the base substrate 10, through the interface between the optical layer 40 and the light emitting layer 22, and exits the pixel structure along a direction substantially upward. Due to the structure of the reflective ridge 30, the light beam transmits through the optical layer 40 in a region close to the peak of the optical layer 40, where the optical layer 40 is disposed substantially horizontally. Thus, the light beam transmitted through the optical layer 40 is along a direction substantially perpendicular to the interface between the optical layer 40 and the light emitting layer 22, and substantially perpendicular to the interface between the light emitting layer 22 and the substantially transparent electrode 23. The light path created by the reflective ridge 30 obviates the occurrence of a total reflection inside the optical layer 40 as a waveguide or inside a combination of the optical layer 40 and the light emitting layer 22 as a waveguide.

Moreover, due to the shape of the reflective ridge 30, a width of the reflective ridge 30 can be made relatively small, and the optical layer 40 on top of the reflective ridge 30 can also be made relatively small. Moreover, the particular light path created by the reflective ridge 30 obviates the total reflection in the optical layer 40. Because the light is not totally reflected by the optical layer 40 due to the light path created by the reflective ridge 30, the degree of a slope angle of the optical layer 40 has little or no effect on the light transmission. Accordingly, the optical layer 40 can be made much smaller than those in FIG. 1 and FIG. 2. As a result, the loss of aperture ratio is much reduced because the area occupied by the optical layer 40 is much smaller as compared to those in FIG. 1 and FIG. 2.

Figure 4:
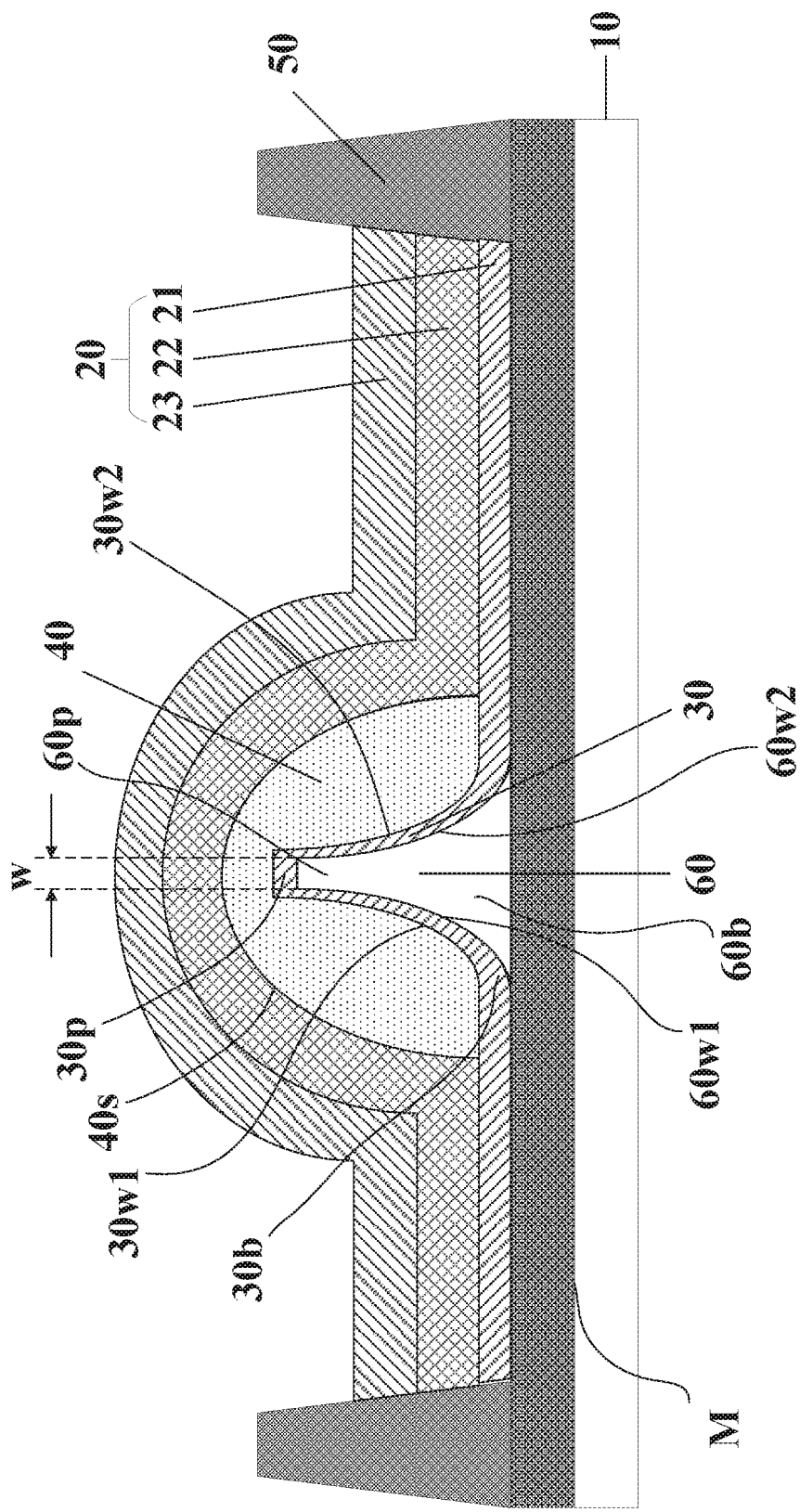
FIG. 4 is a schematic diagram of a pixel structure in some embodiments according to the present disclosure.

FIG. 4 is a schematic diagram of a pixel structure in some embodiments according to the present disclosure. Referring to FIG. 4, the reflective ridge 30 has a first concave reflective sidewall 30w1 extending from a peak 30p of the reflective ridge 30 to a base 30b of the reflective ridge 30, and a second concave reflective sidewall 30w2 extending from the peak 30p of the reflective ridge 30 to the base 30b of the reflective ridge 30, the first concave reflective sidewall 30w1 facing away from the second concave reflective sidewall 30w2. In FIG. 4, the reflective ridge 30 is formed on an insulating ridge 60 on a side of the reflective electrode 21 facing the base substrate 10. The insulating ridge 60 has a first concave insulating sidewall 60w1 extending from a peak 60p of the insulating ridge 60 to a base 60b of the insulating ridge 60, and a second concave insulating sidewall 60w2 extending from the peak 60p of the insulating ridge 60 to the base 60b of the insulating ridge 60, the first concave insulating sidewall 60w1 facing away from the second concave insulating sidewall 60w2. The reflective electrode 21 is disposed on the first concave insulating sidewall 60w1 and the second concave insulating sidewall 60w2, thereby forming the first concave reflective sidewall 30w1 and the second concave reflective sidewall 30w2.

To avoid light diffraction when the light reaches the reflective ridge 30, each of the first concave reflective sidewall 30w1 and the second concave reflective sidewall 30w2 can be made to have a radius of curvature in a range of visible light wavelengths, or greater than the visible light wavelengths. Optionally, each of the first concave reflective sidewall 30w1 and the second concave reflective sidewall 30w2 has a radius of curvature in a range of approximately 400 nm to approximately 750 nm, e.g., approximately 400 nm to approximately 500 nm, approximately 500 nm to approximately 600 nm, and approximately 600 nm to approximately 750 nm.

To further reduce loss of aperture ratio, a width w of the peak 30p of the reflective ridge 30 can be made as small as possible, e.g., close to zero. Optionally, the width w of the peak 30p of the reflective ridge 30 is in a range sufficient to avoid breakdown of the peak 30p due to process errors. Thus, optionally, the width w of the peak 30p of the reflective ridge 30 is made as small as possible allowable by a process margin to maintain the integrity of the peak 30p of the reflective ridge 30. Optionally, the peak 30p of the reflective ridge 30 has a width w less than five times (e.g., less than four times, less than three times, and less than twice) the process margin for forming the peak 30p of the reflective ridge 30. Optionally, the peak 30p of the reflective ridge 30 has a width w approximately equal to the process margin for forming the peak 30p of the reflective ridge 30. Optionally, the process margin is a process margin in an etching process, e.g., a wet etching process. Optionally, the process margin is in a range of approximately 5 nm to approximately 10 nm, e.g., approximately 5 nm.

The optical layer 40 is disposed between the reflective ridge 30 and the light emitting layer 22. An orthographic projection of the optical layer 40 on the base substrate 10 at least partially overlaps with an orthographic projection of the reflective ridge 30 on the base substrate 10. Optionally, the orthographic projection of the optical layer 40 on the base substrate 10 covers the orthographic projection of the reflective ridge 30 on the base substrate 10. Optionally, the orthographic projection of the optical layer 40 on the base substrate 10 at least partially overlaps with an orthographic projection of the insulating ridge 60 on the base substrate 10. Optionally, the orthographic projection of the optical layer 40 on the base substrate 10 covers the orthographic projection of the insulating ridge 60 on the base substrate 10.

In some embodiments, and referring to FIG. 4, the optical layer 40 has a convex side 40s away from the reflective ridge 30. Optionally, the convex side 40s has a radius of curvature in a range of approximately 500 nm to approximately 1500 nm, e.g., approximately 1000 nm.

Figure 5:
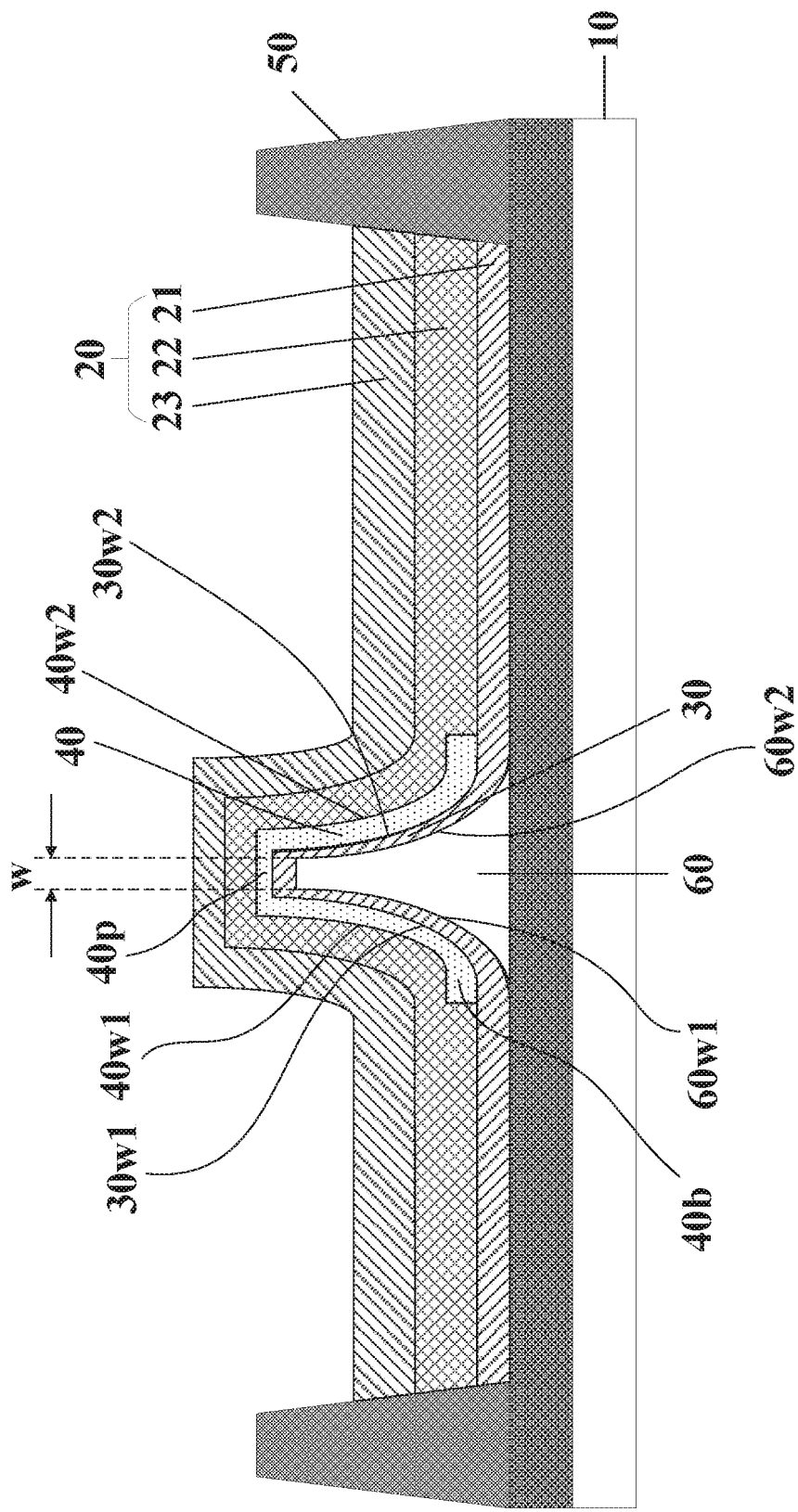
FIG. 5 is a schematic diagram of a pixel structure in some embodiments according to the present disclosure.

FIG. 5 is a schematic diagram of a pixel structure in some embodiments according to the present disclosure. Referring to FIG. 5, the optical layer 40 has a first concave sidewall 40w1 extending from a peak 40p of the optical layer 40 to a base 40b of the optical layer 40, and a second concave sidewall 40w2 extending from the peak 40p of the optical layer 40 to the base 40b of the optical layer 40, the first concave sidewall 40w1 facing away from the second concave sidewall 40w2. Optionally, the first concave sidewall 40w1 covers the first concave reflective sidewall 30w1, and the second concave sidewall 40w2 covers the second concave reflective sidewall 30w2. By having this structure, the optical layer 40 can be made even smaller, occupying a smaller area, resulting a further reduced loss of aperture ratio.

Figure 6A:
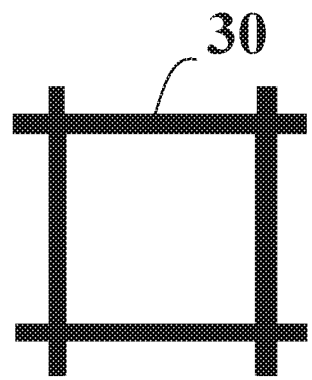
FIGS. 6A to 6F are schematic diagrams of reflective ridges in some embodiments according to the present disclosure.
Figure 6B:
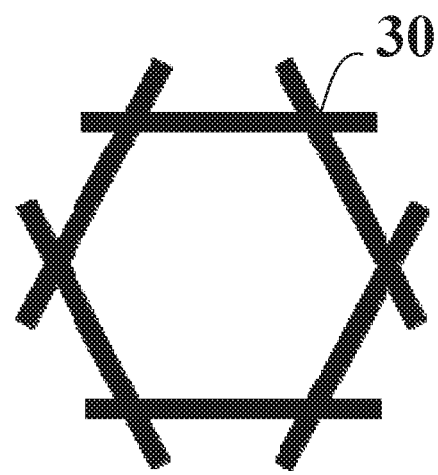
Figure 6C:
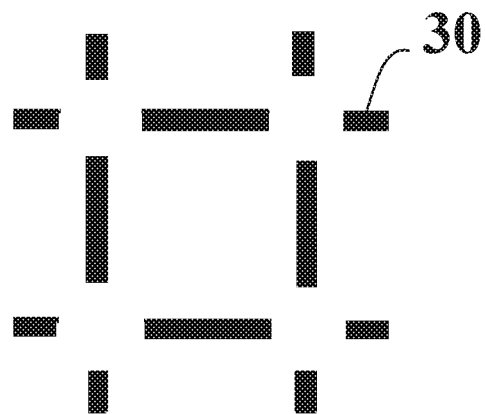
Figure 6D:
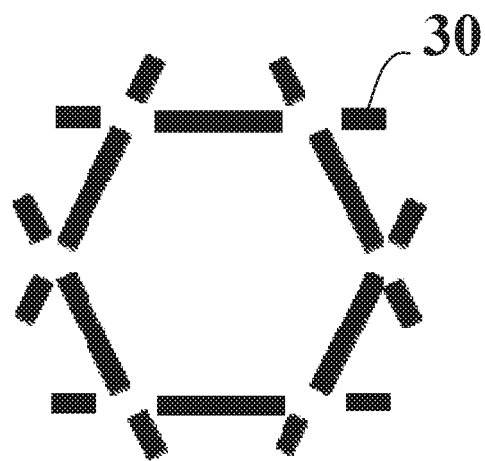
Figure 6E:
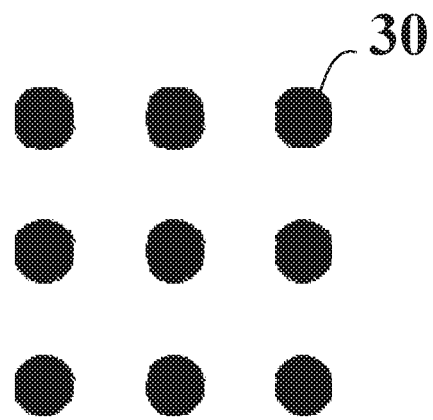
Figure 6F:
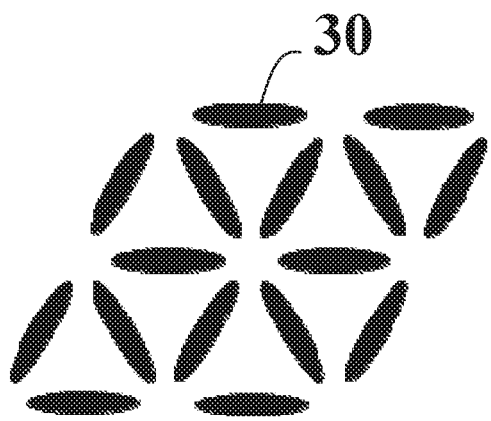

The reflective ridge 30 can be formed in any appropriate pattern in the pixel aperture in a subpixel. Optionally, the reflective ridge 30 is a grid or otherwise has a pattern dividing the pixel aperture into a plurality of sub-regions. FIGS. 6A to 6F are schematic diagrams of reflective ridges in some embodiments according to the present disclosure. Referring to FIG. 6A and FIG. 6B, the reflective ridge 30 in some embodiments is a continuously connected ridge. Referring to FIG. 6C to 6F, the reflective ridge 30 in some embodiments includes a plurality of sub-ridges spaced apart from each other. Each of the plurality of sub-ridges has a cross-section along a plane substantially parallel to a main surface of the base substrate (see annotation M in FIG. 4 for the main surface of the base substrate). The cross-section may have any appropriate shapes. Optionally, the cross-section has a shape selected from a group consisting of a rectangle, a circle, and an ellipse, as shown in FIGS. 6A to 6F.

Because the substantially transparent electrode 23 may be deposited on the light emitting layer 22 at a smaller thickness in regions having the reflective ridge 30, the conductivity of the substantially transparent electrode 23 in these regions may be affected. To obviate any potential conductivity issue, a reflective ridge 30 having a discontinuous pattern can ensure that portions of the substantially transparent electrode 23 in the plurality of sub-regions formed by the pattern of the reflective ridge 30 are well-connected to each other, thereby maintaining a uniform and stable voltage level at various portions of the substantially transparent electrode 23.

Similarly, the insulating ridge 60 has a pattern corresponding to the pattern of the reflective ridge 30. Optionally, the insulating ridge 60 in some embodiments is a continuously connected ridge. Optionally, the insulating ridge 60 in some embodiments includes a plurality of sub-ridges spaced apart from each other. Each of the plurality of sub-ridges has a cross-section along a plane substantially parallel to a main surface of the base substrate. The cross-section may have any appropriate shapes. Optionally, the cross-section has a shape selected from a group consisting of a rectangle, a circle, and an ellipse.

Similarly, the optical layer 40 has a pattern corresponding to the pattern of the reflective ridge 30. Optionally, the optical layer 40 in some embodiments is a continuously connected ridge. Optionally, the optical layer 40 in some embodiments includes a plurality of sub-ridges spaced apart from each other. Each of the plurality of sub-ridges has a cross-section along a plane substantially parallel to a main surface of the base substrate. The cross-section may have any appropriate shapes. Optionally, the cross-section has a shape selected from a group consisting of a rectangle, a circle, and an ellipse.

In some embodiments, the light emitting element is an organic light emitting diode including a reflective electrode (e.g., a reflective anode), an organic light emitting layer on the reflective electrode, and a substantially transparent electrode (e.g., a substantially transparent cathode) on a side of the organic light emitting layer away from the reflective electrode.

In another aspect, the present disclosure provides a method of fabricating a pixel structure. In some embodiments, the method includes forming a light emitting element on a base substrate. The step of forming the light emitting element includes forming a reflective electrode, forming a light emitting layer on the reflective electrode, and forming a substantially transparent electrode on a side of the light emitting layer away from the reflective electrode. Optionally, the reflective electrode is formed to have a reflective ridge configured to reflect light laterally transmitted through the light emitting layer to exit from a light emitting surface of the pixel structure. Optionally, the reflective ridge is formed to have a first concave reflective sidewall extending from a peak of the reflective ridge to a base of the reflective ridge, and a second concave reflective sidewall extending from the peak of the reflective ridge to the base of the reflective ridge, the first concave reflective sidewall facing away from the second concave reflective sidewall.

In some embodiments, prior to forming the reflective electrode, the method further includes forming an insulating ridge. The insulating ridge is formed to have a first concave insulating sidewall extending from a peak of the insulating ridge to a base of the insulating ridge, and a second concave insulating sidewall extending from the peak of the insulating ridge to the base of the insulating ridge, the first concave insulating sidewall facing away from the second concave insulating sidewall. The reflective electrode is formed on the first concave insulating sidewall and the second concave insulating sidewall, thereby forming the first concave reflective sidewall and the second concave reflective sidewall.

In some embodiments, the step of forming the insulating ridge includes depositing an insulating material layer on the base substrate; forming a photoresist layer on the insulating material layer; exposing and developing the photoresist layer using mask plate having a pattern corresponding to the insulating ridge; and etching the insulating material layer using an isotropic etching method, thereby forming the first concave insulating sidewall and the second concave insulating sidewall.

In some embodiments, subsequent to forming the reflective electrode and prior to forming the light emitting layer, the method further includes forming an optical layer. Optionally, the optical layer is formed between the reflective ridge and the light emitting layer. Optionally, an orthographic projection of the optical layer on the base substrate at least partially overlaps with an orthographic projection of the reflective ridge on the base substrate.

In some embodiments, the optical layer is formed using an organic material. Optionally, the optical layer is formed to have a convex side away from the reflective ridge. Optionally, the convex side has a radius of curvature in a range of approximately 500 nm to approximately 1500 nm.

In some embodiments, the optical layer is formed using an inorganic material. Optionally, the optical layer is formed to have a first concave sidewall extending from a peak of the optical layer to a base of the optical layer, and a second concave sidewall extending from the peak of the optical layer to the base of the optical layer, the first concave sidewall facing away from the second concave sidewall.

In some embodiments, the method further includes forming a pixel definition layer on the base substrate for defining a pixel aperture. Optionally, the reflective ridge is formed inside the pixel aperture.

Various appropriate reflective conductive materials and various appropriate fabricating methods may be used to make the reflective electrode. For example, a reflective conductive material may be deposited on the substrate by a plasma-enhanced chemical vapor deposition (PECVD) process. Examples of appropriate reflective conductive materials include, but are not limited to, a metal material such as copper, aluminum, silver, molybdenum, chromium, neodymium, nickel, manganese, titanium, tantalum, and tungsten.

Various appropriate insulating materials and various appropriate fabricating methods may be used to make the insulating ridge. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), and silicon oxynitride ($SiO_xN_y$).

Various appropriate insulating materials and various appropriate fabricating methods may be used to make the pixel definition layer. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), and silicon oxynitride ($SiO_xN_y$).

Various appropriate insulating materials and various appropriate fabricating methods may be used to make the optical layer. For example, an organic or inorganic insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), and silicon oxynitride ($SiO_xN_y$).

Various appropriate reflective conductive materials and various appropriate fabricating methods may be used to make the substantially transparent electrode. For example, a substantially transparent conductive material may be deposited on the substrate by a plasma-enhanced chemical vapor deposition (PECVD) process. Examples of appropriate substantially transparent conductive materials include, but are not limited to, various substantially transparent metallic electrode materials, substantially transparent metal oxide electrode materials, and substantially transparent nano-carbon tubes. Examples of substantially transparent metallic electrode materials include silver and magnesium/silver alloy or laminate. Examples of substantially transparent metal oxide materials include, but are not limited to, indium tin oxide, indium zinc oxide, indium gallium oxide, and indium gallium zinc oxide.

Figure 7A:
FIGS. 7A to 7F illustrate a method of fabricating a pixel structure in some embodiments according to the present disclosure.
Figure 7B:
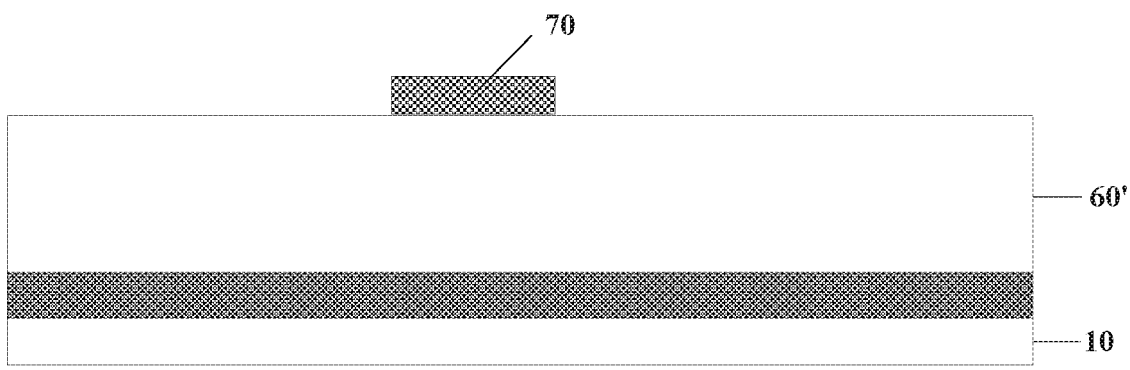
Figure 7C:
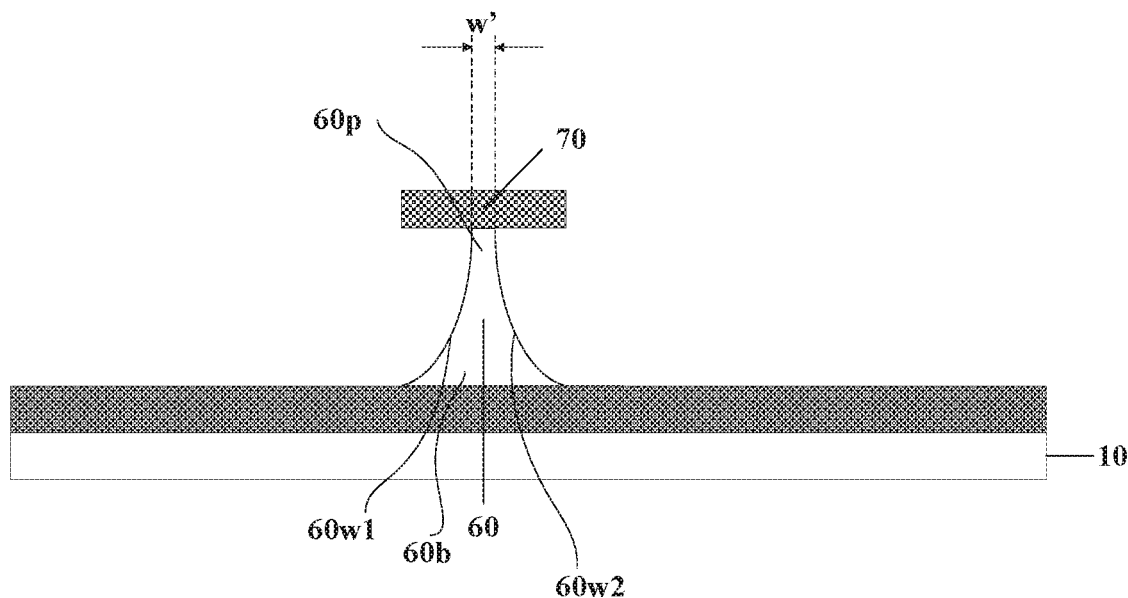

FIGS. 7A to 7F illustrate a method of fabricating a pixel structure in some embodiments according to the present disclosure. Referring to FIG. 7A, an insulating material layer 60' is deposited on a base substrate 10. Referring to FIG. 7B, a photoresist layer 70 is formed on the insulating material layer 60', the photoresist layer 70 is formed to have a pattern corresponding to the pattern of the insulating ridge. Referring to FIG. 7B and FIG. 7C, the insulating material layer 60' is etched using an isotropic etching method. Because the etching is substantially isotropic, the insulating material layer 60' is not only etched in regions absent of a photoresist pattern, but also etched in a region underneath the photoresist pattern, thereby forming an insulating ridge 60. As shown in FIG. 7C, the insulating ridge 60 is formed to have a first concave insulating sidewall 60w1 extending from a peak 60p of the insulating ridge 60 to a base 60h of the insulating ridge 60, and a second concave insulating sidewall 60w2 extending from the peak 60p of the insulating ridge 60 to the base 60h of the insulating ridge 60, the first concave insulating sidewall 60w1 facing away from the second concave insulating sidewall 60w2.

In etching the insulating material layer 60', a width w' of the peak 60p of the insulating ridge 60 is made as small as possible, e.g., close to zero. Optionally, the width w' of the peak 60p of the insulating ridge 60 is made in a range sufficient to avoid breakdown of the peak 60p due to process errors. Thus, optionally, the width w' of the peak 60p of the insulating ridge 60 is made as small as possible allowable by a process margin to maintain the integrity of the peak 60p of the insulating ridge 60. Optionally, the peak 60p of the insulating ridge 60 has a width w less than five times (e.g., less than four times, less than three times, and less than twice) the process margin for forming the peak 60p of the insulating ridge CO. Optionally, the peak 60p of the insulating ridge 60 has a width w approximately equal to the process margin for forming the peak 60p of the insulating ridge 60. Optionally, the process margin is a process margin in an etching process, e.g., a wet etching process. Optionally, the process margin is in a range of approximately 5 nm to approximately 10 nm, e.g., approximately 5 nm.

Figure 7D:
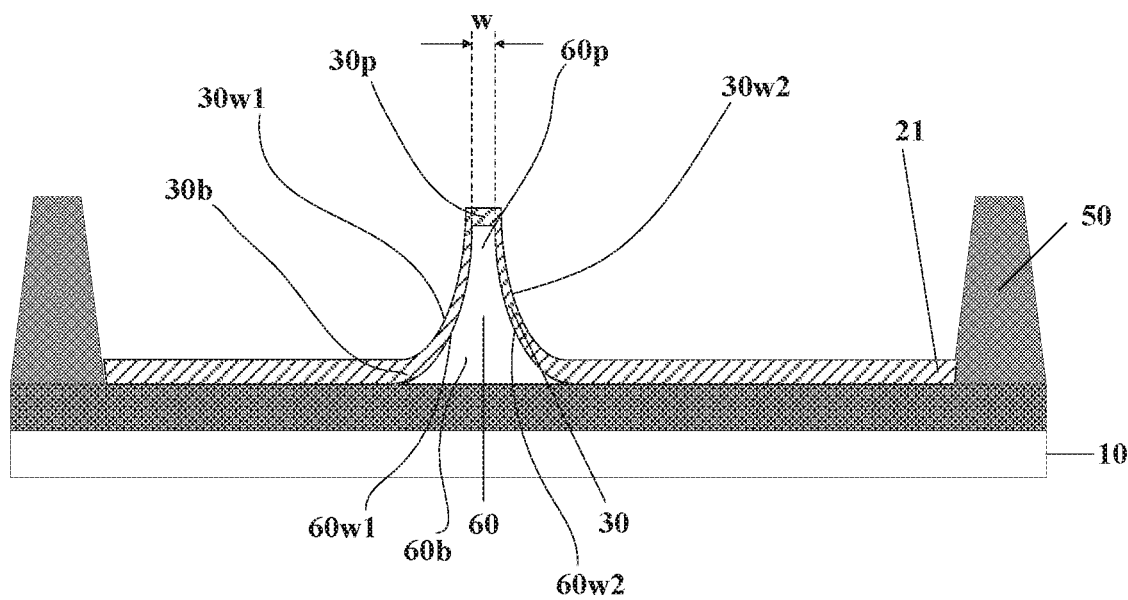

Referring to FIG. 7D, a pixel definition layer 50 is formed to define a pixel aperture. A reflective electrode 21 is deposited in the pixel aperture, the reflective electrode 21 is formed to cover the insulating ridge 60. Specifically, the reflective electrode 21 is formed on the first concave insulating sidewall 60w1 and the second concave insulating sidewall 60w2, thereby forming a reflective ridge 30 having a first concave reflective sidewall 30w1 and a second concave reflective sidewall 30w2. The first concave reflective sidewall 30w1 extends from a peak 30p of the reflective ridge 30 to a base 30b of the reflective ridge 30, and the second concave reflective sidewall 30w2 extends from the peak 30p of the reflective ridge 30 to the base 30b of the reflective ridge 30, the first concave reflective sidewall 30w1 facing away from the second concave reflective sidewall 30w2.

Optionally, a width w of the peak 30p of the reflective ridge 30 can be made as small as possible, e.g., close to zero. Optionally, the peak 30p of the reflective ridge 30 has a width w less than five times (e.g., less than four times, less than three times, and less than twice) the process margin for forming the peak 30p of the reflective ridge 30. Optionally, the peak 30p of the reflective ridge 30 has a width w approximately equal to the process margin for forming the peak 30p of the reflective ridge 30. Optionally, the process margin is in a range of approximately 5 nm to approximately 10 nm, e.g., approximately 5 nm.

Figure 7E:
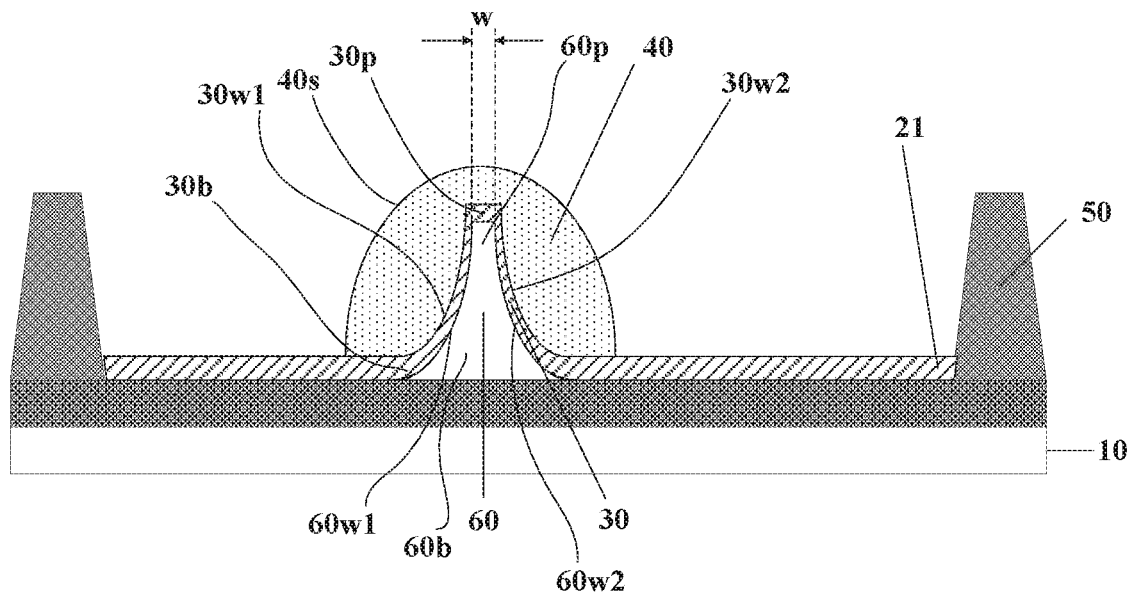

Referring to FIG. 7E, an optical layer 40 is formed on a side of the reflective ridge 30 away from the base substrate 10. The optical layer 40 is formed so that an orthographic projection of the optical layer 40 on the base substrate 10 at least partially overlaps (e.g., covers with an orthographic projection of the reflective ridge 30 on the base substrate 10. Optionally, the optical layer 40 is formed using an organic material. Optionally, the optical layer 40 is formed to have a convex side 40s away from the reflective ridge 30. Optionally, the convex side is formed to have a radius of curvature in a range of approximately 500 nm to approximately 1500 nm.

Figure 7F:
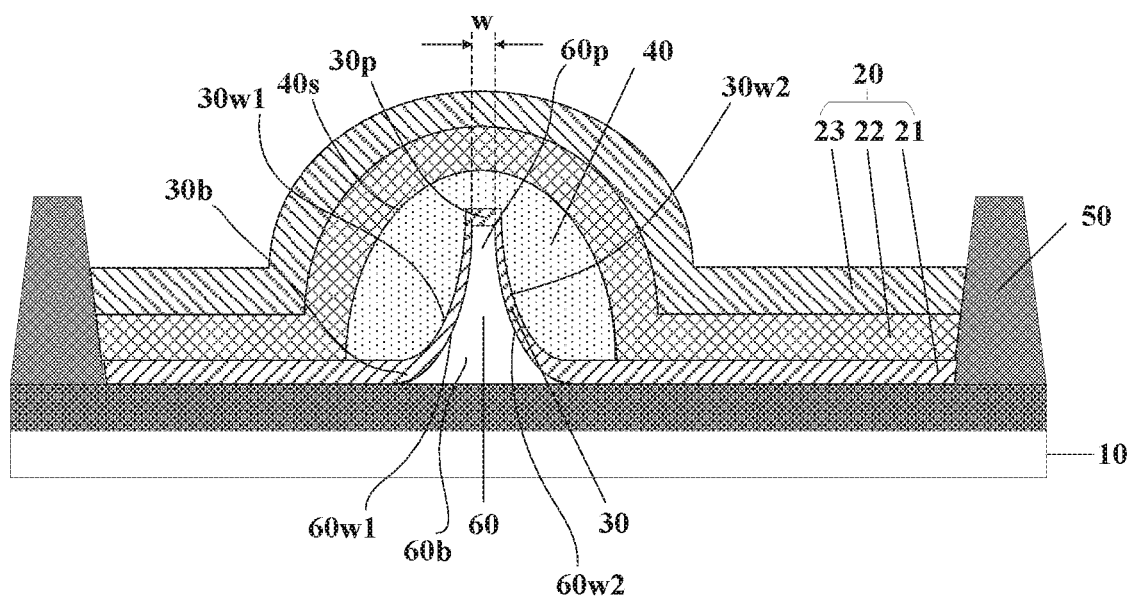

Referring to FIG. 7F, a light emitting layer 22 is formed on the optical layer 40 and the reflective electrode 21, and a substantially transparent electrode 23 is formed on a side of the light emitting layer 22 away from the base substrate 10.

Figure 8A:
FIGS. 8A to 8F illustrate a method of fabricating a pixel structure in some embodiments according to the present disclosure.
Figure 8B:
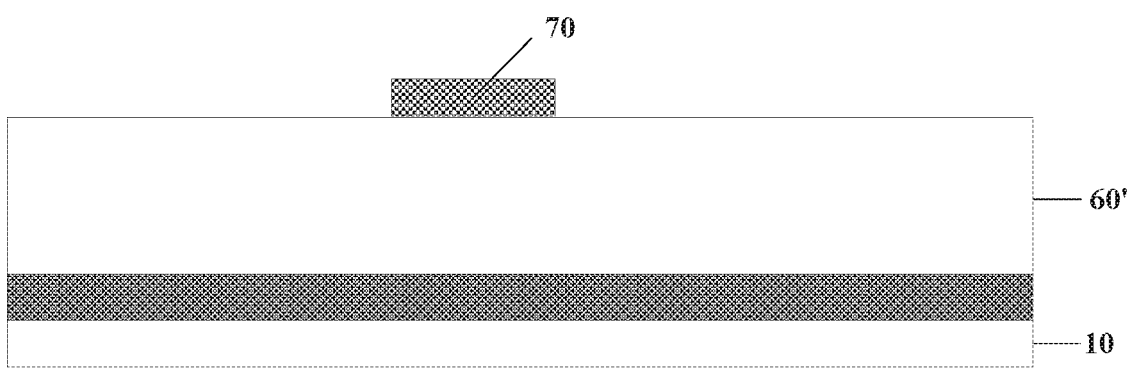
Figure 8C:
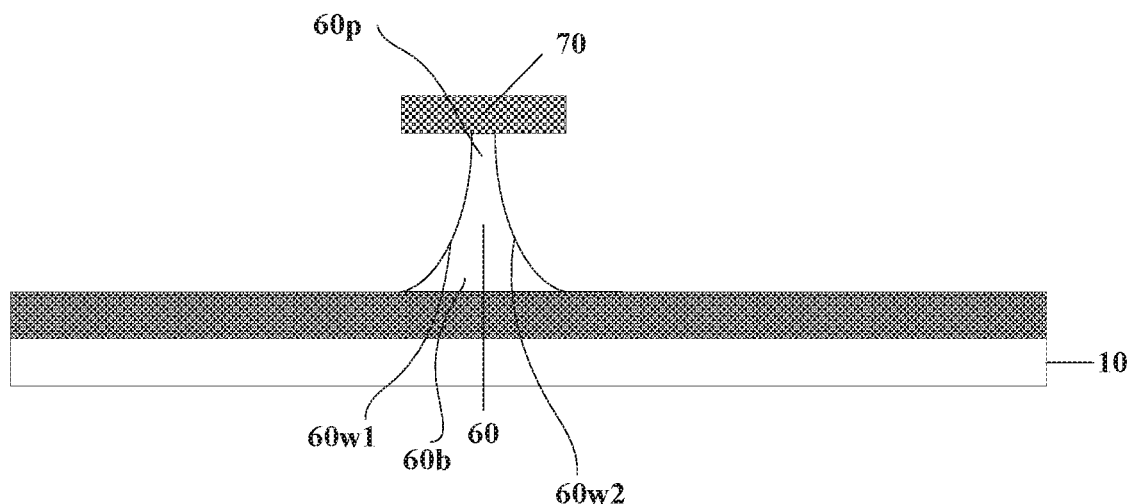
Figure 8D:
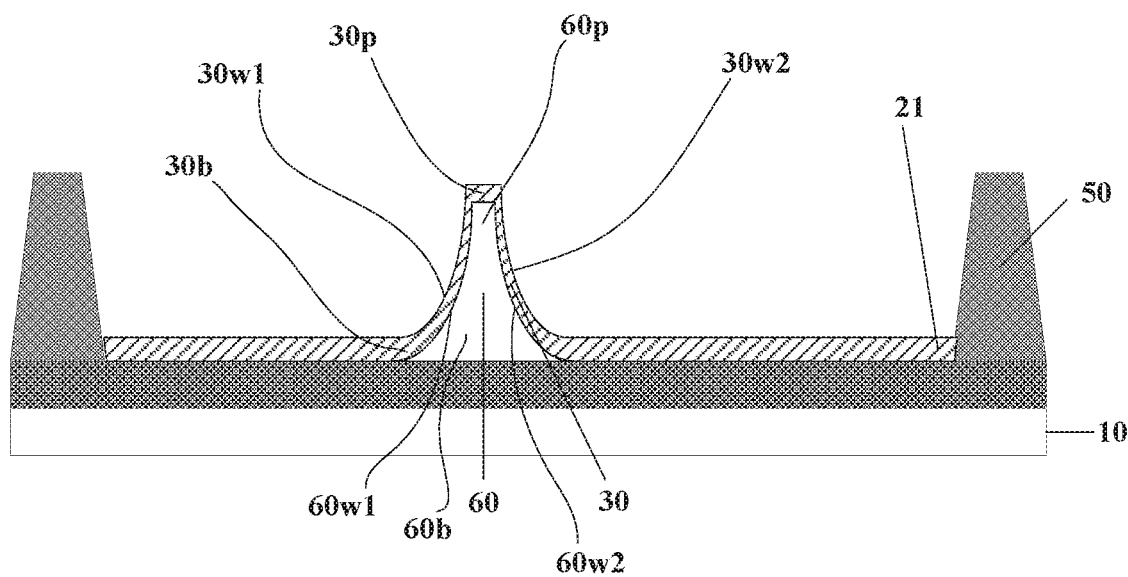
Figure 8E:
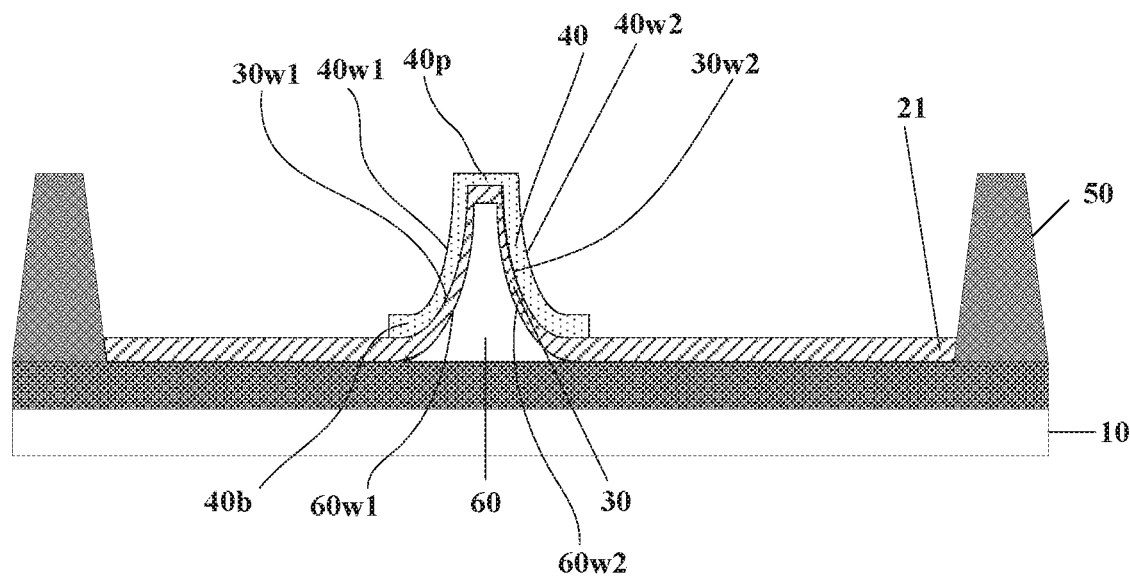

FIGS. 8A to 8F illustrate a method of fabricating a pixel structure in some embodiments according to the present disclosure. The processes described in FIGS. 8A to 8D are substantially the same as those depicted in FIGS. 7A to 7D. Referring to FIG. 8E, subsequent to forming the reflective electrode 21 and prior to forming the light emitting layer 22, the method further includes forming an optical layer 40. Optionally, the optical layer 40 is formed between the reflective ridge 30 and the light emitting layer. Optionally, the optical layer 40 is formed using an inorganic material. Specifically, the optical layer 40 may be formed by depositing an inorganic insulating material on the reflective electrode 21. The insulating material layer can be made relatively thin, and can be patterned to have a contour corresponding to the reflective ridge 30.

Referring to FIG. 8E, the optical layer 40 is formed to have a first concave sidewall 40w1 extending from a peak 40p of the optical layer 40 to a base 40b of the optical layer 40, and a second concave sidewall 40w2 extending from the peak 40p of the optical layer 40 to the base 40b of the optical layer 40, the first concave sidewall 40w1 facing away from the second concave sidewall 40w2. Optionally, the first concave sidewall 40w1 covers the first concave reflective sidewall 30w1, and the second concave sidewall 40w2 covers the second concave reflective sidewall 30w2. By having this structure, the optical layer 40 can be made even smaller, occupying a smaller area, resulting a further reduced loss of aperture ratio.

Figure 8F:
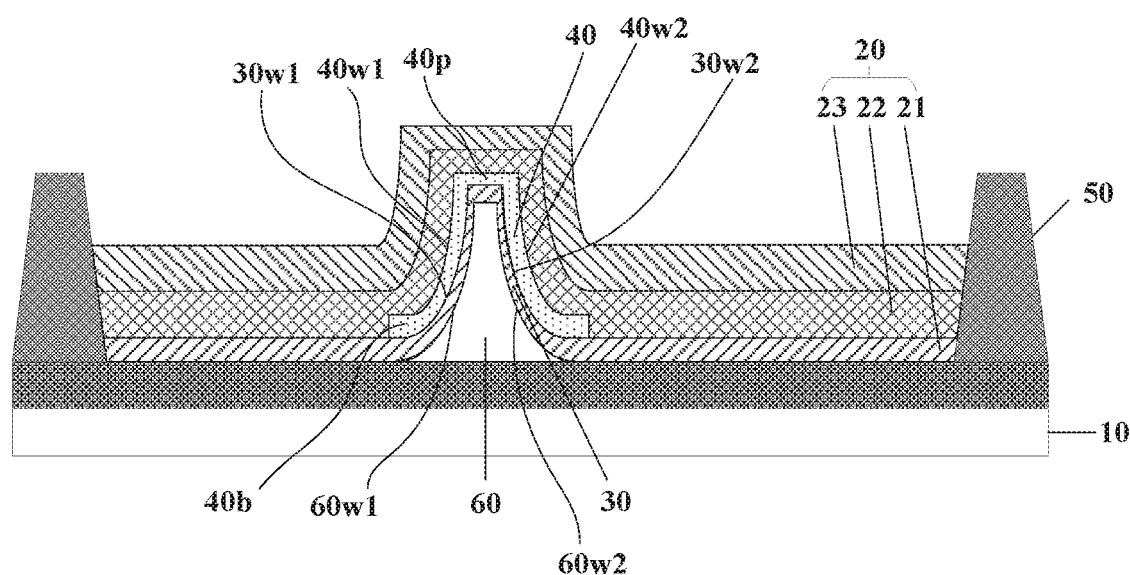

Referring to FIG. 8F, a light emitting layer 22 is formed on the optical layer 40 and the reflective electrode 21, and a substantially transparent electrode 23 is formed on a side of the light emitting layer 22 away from the base substrate 10.

In another aspect, the present disclosure provides a display substrate having the pixel structure described herein or fabricated by a method described herein. In another aspect, the present disclosure provides a display panel having the pixel structure described herein or fabricated by a method described herein. In another aspect, the present disclosure provides a display apparatus having the pixel structure described herein or fabricated by a method described herein. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element, Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A pixel structure, comprising:
  a base substrate; and
  a light emitting element on the base substrate; the light emitting element comprising a reflective electrode, a light emitting layer on the reflective electrode, and a substantially transparent electrode on a side of the light emitting layer away from the reflective electrode;

wherein the reflective electrode has a reflective ridge configured to reflect light laterally transmitted through the light emitting layer to exit from a light emitting surface of the pixel structure; and wherein the reflective ridge has a first concave reflective sidewall extending from a peak of the reflective ridge to a base of the reflective ridge, and a second concave reflective sidewall extending from the peak of the reflective ridge to the base of the reflective ridge, the first concave reflective sidewall facing away from the second concave reflective sidewall;

wherein the pixel structure further comprises an optical layer between the reflective ridge and the light emitting layer;

wherein an orthographic projection of the optical layer on the base substrate at least partially overlaps with an orthographic projection of the reflective ridge on the base substrate.

2. The pixel structure of claim 1, further comprising an insulating ridge on a side of the reflective electrode facing the base substrate;

wherein the insulating ridge has a first concave insulating sidewall extending from a peak of the insulating ridge to a base of the insulating ridge, and a second concave insulating sidewall extending from the peak of the insulating ridge to the base of the insulating ridge, the first concave insulating sidewall facing away from the second concave insulating sidewall; and the reflective electrode is on the first concave insulating sidewall and the second concave insulating sidewall, thereby forming the first concave reflective sidewall and the second concave reflective sidewall.

3. The pixel structure of claim 1, wherein each of the first concave reflective sidewall and the second concave reflective sidewall has a radius of curvature in a range of approximately 400 nm to approximately 750 nm.

4. The pixel structure of claim 1, wherein the optical layer has a convex side away from the reflective ridge; and the convex side has a radius of curvature in a range of approximately 500 nm to approximately 1500 nm.

5. The pixel structure of claim 1, wherein the optical layer has a first concave sidewall extending from a peak of the optical layer to a base of the optical layer, and a second concave sidewall extending from the peak of the optical layer to the base of the optical layer, the first concave sidewall facing away from the second concave sidewall.

6. The pixel structure of claim 1, wherein the reflective ridge is a continuously connected ridge.

7. The pixel structure of claim 1, wherein the reflective ridge comprises a plurality of sub-ridges spaced apart from each other.

8. The pixel structure of claim 7, wherein each of the plurality of sub-ridges has a cross-section along a plane substantially parallel to a main surface of the base substrate, the cross-section has a shape selected from a group consisting of a rectangle, a circle, and an ellipse.

9. The pixel structure of claim 1, further comprising a pixel definition layer on the base substrate and defining a pixel aperture;

wherein the light emitting element is configured to emit light to exit from a light emitting surface of the pixel structure through the pixel aperture; and the reflective ridge is inside the pixel aperture.

10. The pixel structure of claim 9, wherein the reflective ridge divides the pixel aperture into a plurality of sub-regions.

11. A display apparatus, comprising the pixel structure of claim 1.

12. The pixel structure of claim 1, wherein the peak of the reflective ridge has a width less than five times a process margin for forming the peak of the reflective ridge.

13. A pixel structure, comprising:
a base substrate; and
a light emitting element on the base substrate; the light emitting element comprising a reflective electrode, a light emitting layer on the reflective electrode, and a substantially transparent electrode on a side of the light emitting layer away from the reflective electrode;

wherein the reflective electrode has a reflective ridge configured to reflect light laterally transmitted through the light emitting layer to exit from a light emitting surface of the pixel structure;

wherein the reflective ridge has a first concave reflective sidewall extending from a peak of the reflective ridge to a base of the reflective ridge, and a second concave reflective sidewall extending from the peak of the reflective ridge to the base of the reflective ridge, the first concave reflective sidewall facing away from the second concave reflective sidewall; and wherein the peak of the reflective ridge has a width less than five times a process margin for forming the peak of the reflective ridge.

14. A method of fabricating a pixel structure, comprising forming a light emitting element on a base substrate;

wherein forming the light emitting element comprises forming a reflective electrode, forming a light emitting layer on the reflective electrode, and forming a substantially transparent electrode on a side of the light emitting layer away from the reflective electrode;

wherein the reflective electrode is formed to have a reflective ridge configured to reflect light laterally transmitted through the light emitting layer to exit from a light emitting surface of the pixel structure; and wherein the reflective ridge is formed to have a first concave reflective sidewall extending from a peak of the reflective ridge to a base of the reflective ridge, and a second concave reflective sidewall extending from the peak of the reflective ridge to the base of the reflective ridge, the first concave reflective sidewall facing away from the second concave reflective sidewall;

wherein, subsequent to forming the reflective electrode and prior to forming the light emitting layer, further comprising forming an optical layer;

wherein the optical layer is formed between the reflective ridge and the light emitting layer; and an orthographic projection of the optical layer on the base substrate at least partially overlaps with an orthographic projection of the reflective ridge on the base substrate.

15. The method of claim 14, prior to forming the reflective electrode, further comprising forming an insulating ridge;

wherein the insulating ridge is formed to have a first concave insulating sidewall extending from a peak of the insulating ridge to a base of the insulating ridge, and a second concave insulating sidewall extending from the peak of the insulating ridge to the base of the insulating ridge, the first concave insulating sidewall facing away from the second concave insulating sidewall; and the reflective electrode is formed on the first concave insulating sidewall and the second concave insulating sidewall, thereby forming the first concave reflective sidewall and the second concave reflective sidewall.

16. The method of claim 15, wherein forming the insulating ridge comprises:
depositing an insulating material layer on the base substrate;
forming a photoresist layer on the insulating material layer;
exposing and developing the photoresist layer using mask plate having a pattern corresponding to the insulating ridge; and
etching the insulating material layer using an isotropic etching method, thereby forming the first concave insulating sidewall and the second concave insulating sidewall.

17. The method of claim 14, wherein the optical layer is formed using an organic material;
the optical layer is formed to have a convex side away from the reflective ridge; and
the convex side has a radius of curvature in a range of approximately 500 nm to approximately 1500 nm.

18. The method of claim 14, wherein the optical layer is formed using an inorganic material; and
the optical layer is formed to have a first concave sidewall extending from a peak of the optical layer to a base of the optical layer, and a second concave sidewall extending from the peak of the optical layer to the base of the optical layer, the first concave sidewall facing away from the second concave sidewall.

19. The method of claim 14, further comprising forming a pixel definition layer on the base substrate for defining a pixel aperture;
wherein the reflective ridge is formed inside the pixel aperture.

* * * * *